US007768280B1

(12) United States Patent
Wright et al.

(10) Patent No.: US 7,768,280 B1
(45) Date of Patent: Aug. 3, 2010

(54) APPARATUS FOR A LOW-COST SEMICONDUCTOR TEST INTERFACE SYSTEM

(75) Inventors: Adam J. Wright, Saratoga, CA (US); Joseph W. Foerstel, Santa Clara, CA (US); Mark Andrew Banke, San Jose, CA (US); Ken A. Ito, San Jose, CA (US)

(73) Assignee: Altera Corporation, San Jose, CA (US)

( * ) Notice: Subject to any disclaimer, the term of this patent is extended or adjusted under 35 U.S.C. 154(b) by 82 days.

(21) Appl. No.: 11/941,034

(22) Filed: Nov. 15, 2007

(51) Int. Cl.
*G01R 31/02* (2006.01)
(52) U.S. Cl. ............... 324/754; 324/755; 324/158.1
(58) Field of Classification Search .................. None
See application file for complete search history.

(56) References Cited

U.S. PATENT DOCUMENTS 5,010,446 A * 4/1991 Scannell ..................... 361/749
5,523,695 A * 6/1996 Lin .............................. 324/755
6,040,624 A * 3/2000 Chambers et al. ........... 257/692
6,532,157 B1 * 3/2003 Glenn et al. ................. 361/767
6,721,189 B1 * 4/2004 Haba ........................... 361/792

* cited by examiner

*Primary Examiner*—Minh N Tang
(74) *Attorney, Agent, or Firm*—Martine Penilla & Gencarella, LLP

(57) ABSTRACT

A system for testing a device under test (DUT), in which electrical coupling among a module board, a low profile connector, and, a DIB is established by applying a pressure on the module board toward the DUT, is provided. The system includes a test head bracket secured inside a test head, the test head bracket includes the module board having a first section including a plurality of connectors to couple a test analyzer to the module board, a second section including a plurality of contacts pads to electrically couple the module board to the DUT, and, a flexible board to enable the first section to be placed at an angle with respect to the second section. The test head bracket also includes a module board stiffener mechanically securing the first section and the second section to the test head and the low profile connector electrically couples the module board to the DUT.

12 Claims, 7 Drawing Sheets

APPARATUS FOR A LOW-COST SEMICONDUCTOR TEST INTERFACE SYSTEM

BACKGROUND OF THE INVENTION

Testing is a critical activity in semiconductor device manufacturing, including probe and assembly operations. The manufacturing environment at the testing stage is characterized by multiple products, test equipment with varying capability, and specialized kits and handlers that may be product and equipment specific.

Currently available commercial test-interface systems are incapable of being quickly adapted for testing of different types of devices and consequently do not allow for expanded testing of the device under test. Moreover, commercial test-interface systems are not capable, without being substantially modified, of testing both digital and analog devices. Furthermore, the mechanical design of commercial test-interface systems limits a use of high frequency clock for testing.

A conventional semiconductor test system for testing semiconductor integrated circuit devices includes a handler, a test head, and, a test analyzer. The test head includes pins that are mounted in the test head on pin cards and are connected to respective pin electronics circuits. The pin electronics circuits generate stimulus signals for a test application to the input pins of a device under test (DUT) to test or measure response signals provided at output pins of the DUT.

For testing, the DUT is fitted in a socket that is attached to a DUT board mounted in a test handler. Generally speaking, the test head is positioned with its DUT engagement board facing toward the OUT board. The DUT engagement board includes tester pins. The tester pins engage the DUT board, which make electrical connections between the tester pins and the DUT.

Currently available commercial test-interface systems generally use pogo pin systems for interfacing with a DUT. The Pogo pin connectors are expensive and have a short life span due to frequent pin bending and breakages. The need for replacing these connectors considerably reduces overall efficiency of the testing system. Furthermore, because test signals have to travel comparatively long distance, the clock frequency of the test signals is limited due to the length of the signal path.

Hence, it is within this context that embodiments of the invention arise.

SUMMARY OF INVENTION

Broadly speaking, the present invention fills these needs by providing a module board that includes a flexible board section to allow bending of the module board to reduce the size of the test head and to enable use of mechanically efficient device interface board (DIB) interface connectors.

In one aspect, a system for testing a device under test (DUT) is disclosed. The system includes one or more module boards to provide coupling of a test analyzer with the DUT. Each of the module boards include one or more low profile connectors to provide a coupling between the respective module board to the DUT. Broadly speaking, a module board has three parts, a first section, a second section, and a flexible section. The first section is configured to receive electrical wires from the test analyzer. The second section is configured to receive one or more low profile connectors. The low profile connector provides a coupling between the module board and the DUT. The flexible section provides a coupling between the first section and the second section. The module board is mounted and secured on a test head bracket. The flexible board enables the first section to be placed at an angle with respect to the second section in the test head bracket. It should be appreciated that the DUT may be any integrated circuit including programmable logic devices, processors, application specific integrated circuits, etc.

In one embodiment, a system for testing the DUT, in which electrical coupling among a module board, a low profile connector, and, a DIB is established by applying a pressure on the module board toward the DUT, is provided. The system includes a test head bracket secured inside a test head. The test head bracket includes, the module board which has a first section, a flexible section, and a second section. The second section includes a plurality of contacts pads to electrically couple the module board to the DUT through a low profile connector and a DIB. The test head bracket also includes a module board stiffener mechanically securing the module board.

In another embodiment, a low profile connector to establish electrical coupling between a module board and a device interface board is provided. The low profile connector includes a block made of an electrically non-conducting material. The block includes a grid having a plurality of holes with respective connector wires. Each of the connector wires has a top section, a bottom section, and a middle section. The top section and the bottom section are curved with respect to the middle section.

Other aspects and advantages of the present invention will become apparent from the following detailed description, taken in conjunction with the accompanying drawings, illustrating by way of example the principles of the present invention.

BRIEF DESCRIPTION OF DRAWINGS

The present invention will be readily understood by the following detailed description in conjunction with the accompanying drawings. To facilitate this description, like reference numerals designate like structural elements.

The figures are provided in order to provide a thorough understanding of the present invention. The figures should not be construed as limiting the breath of the invention in any manner.

DETAILED DESCRIPTION

An invention for an apparatus for a low-cost semiconductor test interface system is disclosed. In the following description, numerous specific details are discussed in order to provide a thorough understanding of the present invention. In one embodiment of the invention, a module board for the test head of a device test system is provided to enable designing a low-cost, extendable and mechanically efficient test head.

The module board is designed to remove mechanical inefficiencies of commercially available pogo pin test boards. The pogo pin connectors include thin and long substantially straight metallic pins (or connector wires) projected out of the pogo pin connector base block. The pogo pin connectors are expensive and have a short life span due to frequent pin bending and breakages. Replacing these connectors results in reduced overall efficiency. Furthermore, because test signals sent from a test analyzer to a device under test have to travel comparatively long distances, the clock frequency of the test signal is limited due to the length of the signal path.

The design of the module board described herein allows easier expansion of tests by providing an interface to add test extenders or daughter board cards to the module board. Furthermore, use of a flexible board section in the module board allows the module board to fit into a test head much smaller in size. The flexible board section also enables use of the low profile connectors in the module board. The low profile connector is designed to enhance mechanical efficiency of the testing system in one embodiment. The low profile connector is also designed to provide the use of a higher clock speed during the testing by reducing the length of the path a signal has to travel from the test head to the device under test. The apparatus described herein provides an extendable generic mechanical and electrical interface between the test analyzer and the device interface board. The device interface board provides a customizable mechanical and electrical interface between the test head and the device under test. Furthermore, the low profile connectors provide mechanical efficiency and a low cost.

A modular design of the testing system, including the test board, allows fitting a plurality of module boards in the test head to enable conducting a plurality of device tests simultaneously, thereby reducing the testing time. With this overview in mind, the following figures will illustrate exemplary structure and functionality of a module board and related components.

Figure 1:
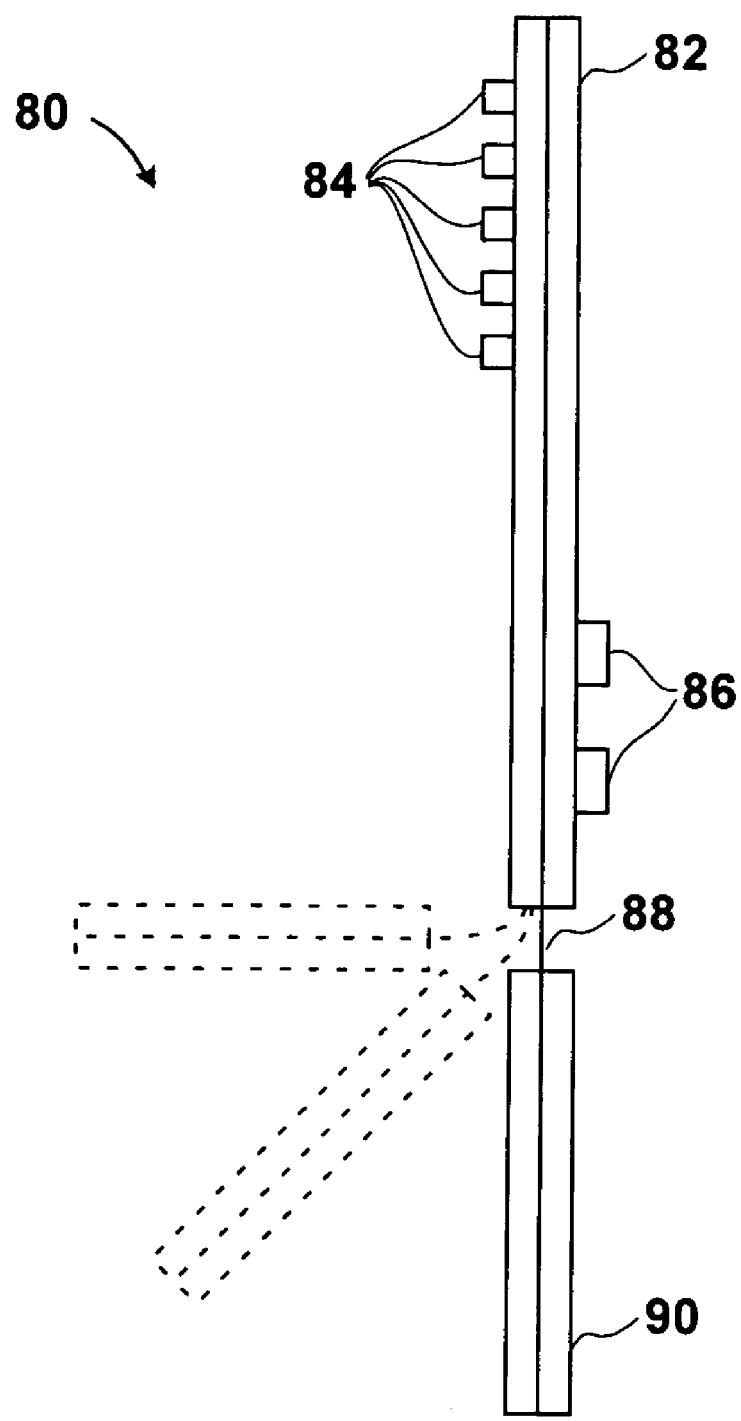
FIG. 1 is a simplified schematic diagram illustrating a module board showing different sections of the module board, in accordance with one embodiment of the present invention.

FIG. 1 illustrates a module board 80 in one embodiment. The module board 80 broadly includes three sections; a first section 82, a flexible board 88, and, a second section 90. It should be appreciated that all three sections 82, 88, and 90, are in electrical communication with each other. A device interface board (DIB) is provided to enable a generic design for the module board 80, i.e., the module board 80 may be used for testing different types of device under test in one embodiment. To enable this reusable functionality, the DIB has two interfaces, a module board side interface and a DUT side interface. The module board side interface remains consistent for different types of DUTs. The DUT side interface changes for different types of DUTs. Hence, the module board 80 can be used for testing many types of digital or analog DUTs including programmable logic devices, as well as any other integrated circuits, such as microprocessors and application specific integrated circuits.

As illustrated in FIG. 1, the flexible board 88 allows the second section 90 to be moved and placed in different positions inside of the test head. Hence, the flexible board 88 provides space economy inside of the test head, i.e., the form factor of the test head can be reduced relative to a form factor for a test head with a rigid module board. The flexible board 88 may be composed of a material which bends yet is strong enough to maintain the electrical connections between the first and second sections. In one embodiment, flexible board 88 is composed of a polyimide material, such as KAPTON™. In another embodiment, the flexible material is resistant to heat, has dimensional stability, and a relatively low dielectric constant, e.g., less than 5. This design allows placement of the module board 80 in a smaller size test head because the module board 80 can be bent to be affixed to two side walls in the test head. It should be appreciated that a module board without a flexible board would have to be placed either on the vertical wall or on the bottom wall, which would increase the width or the height of the test head respectively. In one embodiment, the flexible board is sandwiched between opposing rigid surfaces on both the first and second sections. The material for the opposing rigid surfaces is a non-conductive plastic, ceramic, or a fiberglass material in one embodiment.

Still referring to FIG. 1, the ribbon cable connectors 84 are provided to enable the test analyzer to be connected to the module board through the ribbon cables. The test extender/daughter board connectors are provided to allow a test extender board to be coupled to the module board 80 for extending or enhancing device tests without making changes in the test analyzer. In one embodiment, the test extender may also provide pre or post processing of input/output signals to/from the DUT.

Figure 2:
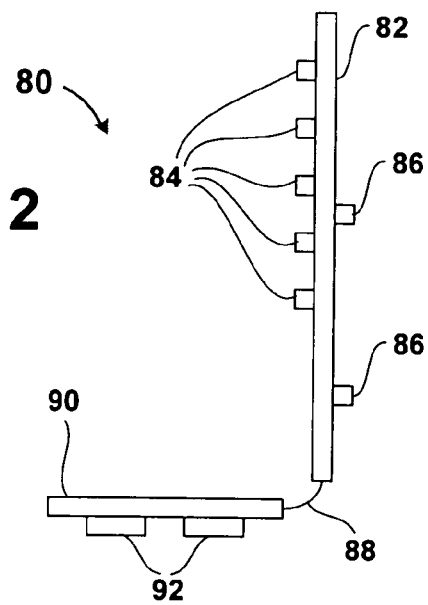
FIG. 2 illustrates different sections of the module board and low profile connectors, in accordance with one embodiment of the present invention.

FIG. 2 illustrates the low profile connectors 92 affixed to the second section 90 in the module board 80. The low profile connector 92 is a relatively thin block made of an electrically non conducting material. The low profile connector 92 does not use pogo pins in one embodiment. Hence, the low profile connector 92 does not inherit disadvantages of the pogo pins in this embodiment.

Figure 3A:
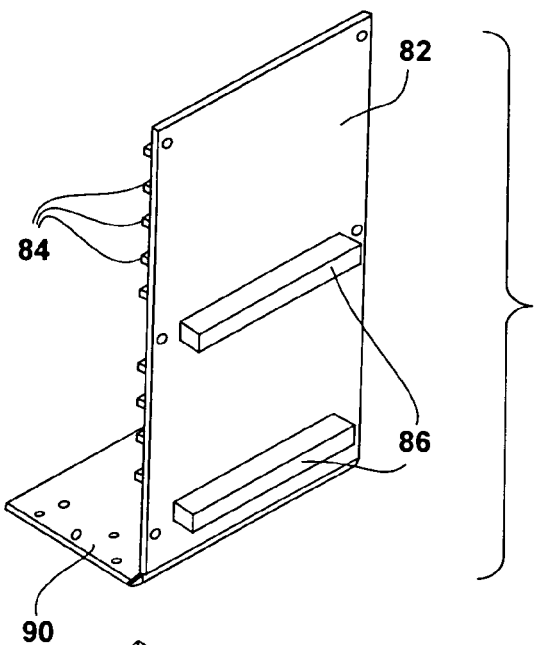
FIGS. 3A and 3B illustrates varying perspective views of the module board and the low profile connectors, in accordance with one embodiment of the present invention.
Figure 3B:
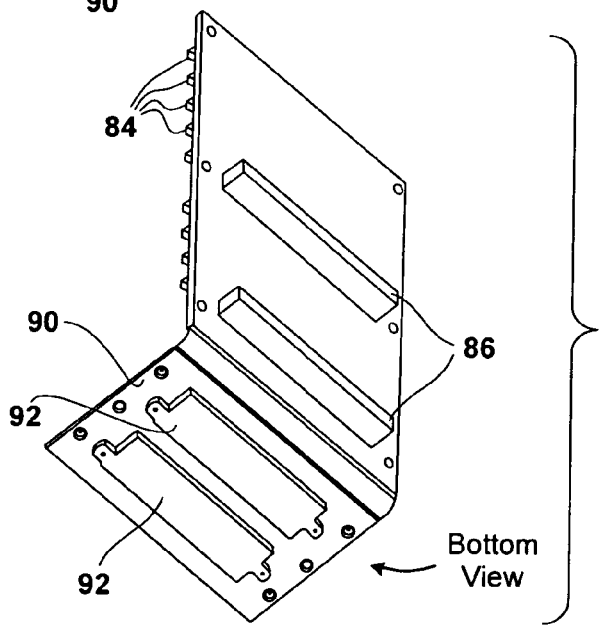

FIG. 3A and FIG. 3B illustrate a module board 80 in different orientations in one embodiment to further clarify relative positions of different components of the module board 80. As illustrated, the ribbon cable connectors 84 are on one side of the first section 82 and the test extender connectors 86 are on the other side (or opposing side) of the first section 82. In another embodiment, the ribbon cable connectors 84 may be placed on the same sides of the first section 82. In yet another embodiment, the ribbon cable connectors 84 and the test extender connectors 86 may be placed on either side in any position, so long as the ribbon cables from the test analyzer can be mechanically and electrically connected to the module board 80, and the module board 80 can be mechanically and electrically connected to a test extender or a daughter board. In one embodiment, the ribbon cable connectors 84 and the test extender connectors 86 are placed across the width of the module board 80. In another embodiment, the ribbon cable connectors 84 and the test extender connectors 86 may be laid out across the length of the module board 80. In yet another embodiment, the ribbon cable connectors 84 and the test extender connectors 86 can be placed in any orientation on the first section 82 so long as the test analyzer and the test extender can be electrically and mechanically coupled to the module board 80.

Referring to FIG. 3B, a bottom view of the module board 80 illustrates the low profile connectors 92 in accordance with one embodiment of the invention. In one embodiment, the module board 80 includes two low profile connectors 92. In another embodiment, one or more low profile connectors 92 may be used by the module board 80 depending upon the DUT testing requirements. In one embodiment, the low profile connector 92 is laid out across the width of the second section 90. The low profile connector 92 may be laid out across the length of the module board 80. It should be appreciated that the low profile connector 92 may be laid out in any orientation so long as it is mechanically possible to allow the low profile connector 92 to be placed in mechanical and electrical contact with the DIB.

Figure 4:
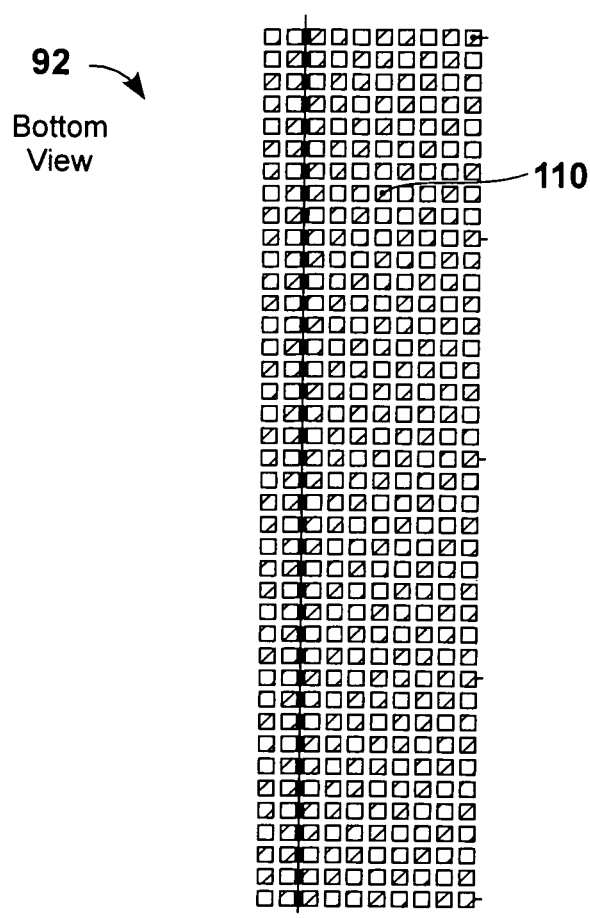
FIG. 4 illustrates a bottom view of a low profile connector showing a plurality of holes for placing metallic pings therein, in accordance with one embodiment of the present invention.

FIG. 4 illustrates a bottom view of the low profile connector 92. In one embodiment, the low profile connector is a rectangular block of an electrically non-conducting and mechanically rigid material in which the thickness of the block is substantially smaller than the length of the block. It should be noted that any suitable plastic may be used for the rectangular block in one embodiment. In another embodiment, the low profile connector is circular in shape in which the thickness of the low profile connector is substantially smaller than the diameter of the low profile connector. In other embodiments, the shape of the low profile connector may be an oval, quadrilateral, etc. One skilled in the art will appreciate that numerous shapes for the low profile connector may be integrated into the embodiments described herein.

Still referring to FIG. 4, the low profile connector block has a grid having a plurality of holes 110 across the thickness of the block. The holes 110 are configured to receive respective connector wires or pins. In one embodiment, the holes 110 are circular. In another embodiment, the holes 110 are quadrilateral in shape at the openings. It should be appreciated that the holes 110 could be of any shape so long as a metallic pin can be placed in the holes 110. The low profile connector has a thickness of less than 5 millimeters in one embodiment. In another embodiment, the thickness of the low profile connector is about 3 millimeters.

The second section 90 of the module board (see FIG. 2) has a plurality of metallic contact pads corresponding to the holes 110 in the low profile connector 92 of FIG. 4. A contact pad is a small plate of metal substantially the size of the opening of the hole 110 on the low profile connector 92. In one embodiment, there is one separate contact pad on the second section 90 for each hole 110 in the low profile connector 92 and each of the contact pads are electrically isolated from each other. In another embodiment, the contact pads are arranged in substantially same area as the holes 110 on the low profile connector 92.

Still referring to FIG. 4, the DIB has a plurality of metallic contact pads corresponding to the holes 110 in the low profile connector 92. A contact pad on the DIB is a small plate of metal substantially of the size of the opening of the hole 110 on the low profile connector 92. In one embodiment, there is one separate contact pad on the DIB for each of the holes 110 in the low profile connector 92. In another embodiment, the contact pads are arranged in substantially the same rectangular dimensions as the holes 110 on the low profile connector 92 and are electrically isolated from each other. The contact pads on the DIB and on the second section 90 may be arranged in any manner so long as it is mechanically and electrically possible to make a contact between the connector wires placed in the holes 110 in low profile connector 92 and the corresponding contact pads on the DIB and the second section 90.

Figure 5A:
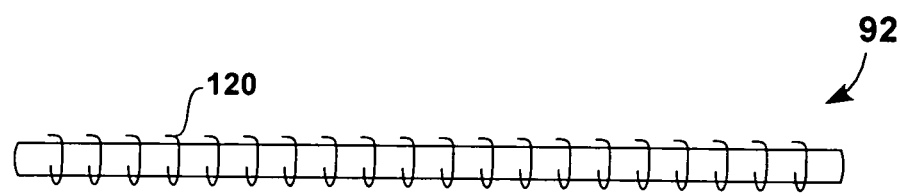
FIGS. 5A and 5B illustrate a cross section of a low profile connector showing connector wire placed in the low profile connector holes, in accordance with one embodiment of the present invention.

FIG. 5A illustrates a cross-sectional side view of the low profile connector 92 block. Special shape pins 120 are placed in the holes 110. In one embodiment, each of the holes 110 in the low profile connector has a pin 120. In another embodiment, pins 120 are placed in a portion of the holes 110 as needed by the DIB card interface. In one exemplary embodiment, the grid defined by the low profile connector has 400 holes, i.e., ten by forty. In addition, the grid may have two different heights where a height of the lengthwise members is greater than a height of the widthwise members. In this manner, the top section of the pins has room to further bend or flex as a surface is forced up against the top section.

Figure 5B:
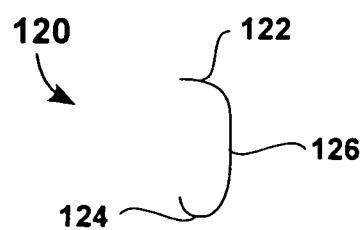

FIG. 5B illustrates a magnified view of pins 120. In one embodiment, pin 120 includes a top section 122, a bottom section 124 and a middle section 126. Pin 120 is substantially straight in the middle section 126. The top section 122 and the bottom section 124 are bent to make a curve or angle with respect to the middle section 126. The middle section 126 traverses through holes 110 while the top section 122 and the bottom section 124 are projected out of holes 110. In one embodiment, the top section 122 and the bottom section 124 make an angle between slightly more than 90 degrees and slightly less than 180 degrees, respectively, from the middle section 126. It should be appreciated that pin 120 may be bent in any manner in the top section 122 and the bottom section 124 so long as the pin 120 can be placed in hole 110 and the pin 120 can be slightly projected from the low profile connector 92 block on the top section 122 and the bottom section 124 to enable electrical contact between pins 120 and the DIB on one side and the module board 80 on the other side. In one embodiment, the backside of middle section 126 of pin 120 is in contact with an inner surface of a corresponding hole to provide support within the hole.

Still referring to FIG. 5B, the top section 122 and the bottom section 124 of pin 120 are both slightly projected out of the low profile connector 92. This special shape of pin 120 enables firm contact between the contact pads on the second section 90 and the low profile connector 92 and the low profile connector 92 and the contact pads on the DIB when an appropriate pressure is applied between the second section 90 of the module board and the DIB (see FIG. 2). Because there are no long pins in the low profile connector 92, the low profile connector 92 can withstand wide variations in the pressure being applied thereupon. On the contrary, if less than appropriate pressure is applied on a pogo pin connector, pogo pins would not make firm electrical contact with the DUT and if more than appropriate pressure is applied on the pogo pin connector, pogo pins would bend and possibly cause a short circuit.

In another embodiment, the low profile connector 92 block is about 2.5 millimeter thick, about 13 millimeters wide, and about 54 millimeters long. In another embodiment, the thickness, the width, and the length of the low profile connector 92 block are in a range of between about 1 to 5 millimeters, 5-20 millimeters, and 30-70 millimeters, respectively. The flexible section 88 of the module board 80, in one embodiment, provides a separation in a range of about 5 to 15 millimeters between the first section 82 and the second section 90. In yet another embodiment, the length of the first section 82 is in a range of 80 millimeter to 150 millimeter. In a preferred embodiment, the length of the first section 90 is in a range of 50 millimeters to about 100 millimeters. In one embodiment, the width of the first section 82, the second section 90, and the flexible section 88 is about 150 millimeters.

Pins 120 are mostly hidden in holes 110 in the low profile connector 92. From outside, the low profile connector 92 appears to be a block of material. Hence, it is relatively easier to handle the low profile connector 92 because of the absence of the long pogo pins. Furthermore, this design of the low profile connector 92 allows having a greater number of pins in the low profile connector 92 compared to pogo pin connectors. In one embodiment, the low profile connector 92 houses 2048 pins. Since the low profile connector has a thickness of less than 5 millimeters, it should be noted that the pin 120 will have a similar height that is slightly larger to extend out from the low profile connector.

Pins 120 in the low profile connector 92 are substantially smaller in length compared to a typical pogo pin. In one embodiment, the thickness of the low profile connector 92 is approximately 2.5 millimeter. Hence, the length a signal travels from the module board 80 to the DIB is also smaller. Due to this smaller signal path, a higher frequency signal may be used for testing. This use of higher frequency increases the usefulness of the test head using the module board 80 including the low profile connector 92 because the test head can now be used to test high frequency circuit boards or devices. In one embodiment, a frequency up to 2 GHz may be employed for testing compared to 200 MHz being used in a test head using a pogo pin connector.

In one embodiment, when the bottom section 124 of pin 120 make a contact with a contact pad on either the second section 90, the pressure on the second section 90 pushes the bottom section 124 of pin 120 towards contact pads on the DIB. Similarly, a pressure on the top section 122 of pin 120 pushes the bottom section 126 towards the second section 90. Hence, a firm contact is established among the second section 90, the low profile connector 92 and the DIB without any use of a cable, permanent soldering, or, any other type of coupling requiring permanently or semi-permanently affixing the low profile connector 92 to either the DIB or the second section 90.

The above described mechanical and electrical contacts enable DUT loading and unloading times to be reduced since there is no cable or any permanent/semi-permanent bonding between the low profile connector 92 and the DIB or the second section (DIB side module board) 92. In addition, the pins 120 are not prone to undesirable bending and breaking as is common with pogo pins. Moreover, there is no danger of short-circuit due to a pin bending because the pin 120 is relatively small and a major portion of the pin remains contained within the protected cavity of the hole 110.

Figure 6:
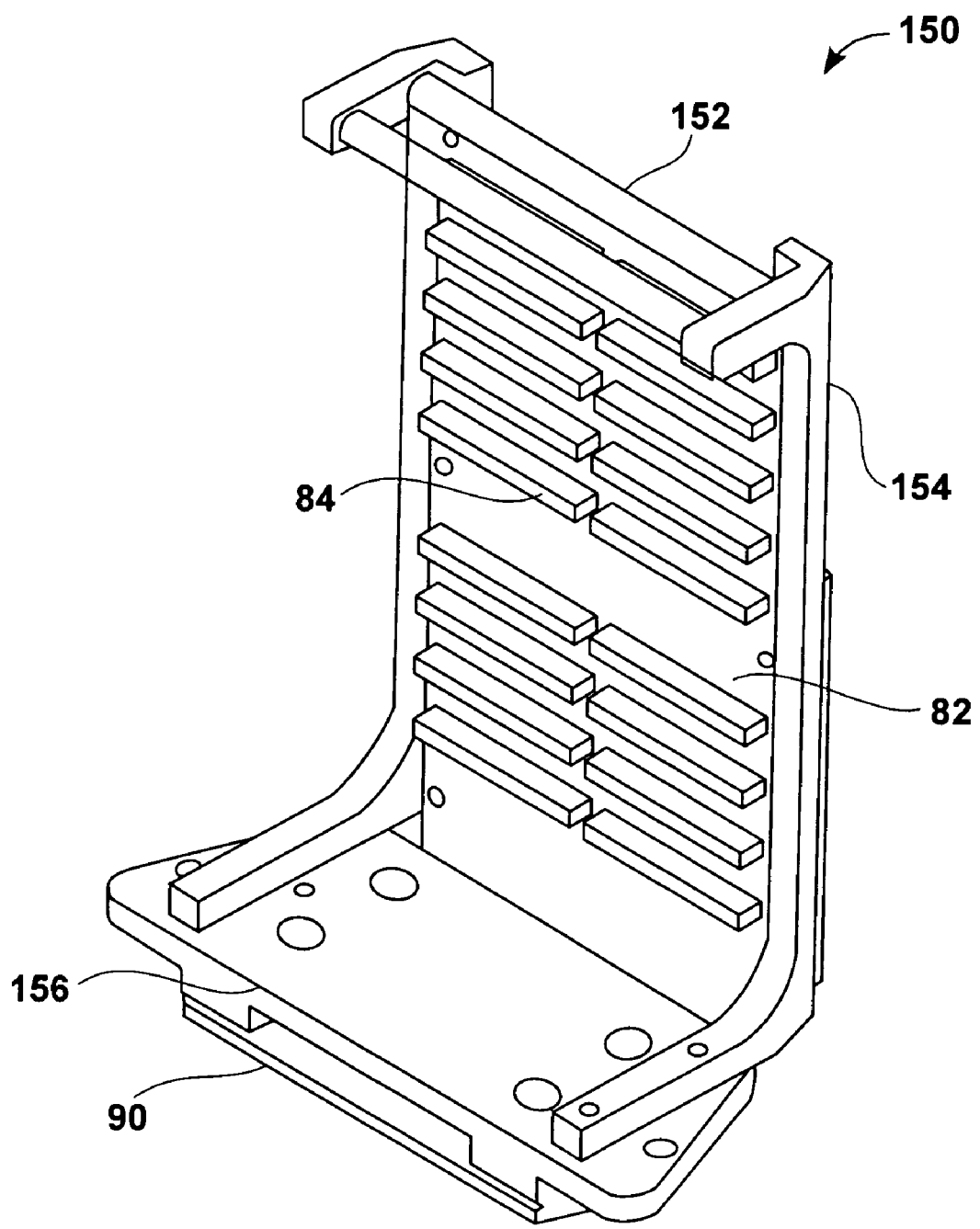
FIG. 6 illustrates a test head bracket including the module board and module stiffeners, in accordance with one embodiment of the present invention.

FIG. 6 illustrates a test head bracket 150. The test head bracket 150 provides a mechanical arrangement for placing the module board 80 in the test head. The test head bracket 150 provides cable guards 152 to hold the incoming cables into the test head. In one embodiment, the test head bracket 150 is substantially L shaped, i.e., the first section 82 is placed in the test head bracket 150 at about 90 degree angle to the second section 90. The module board 80 which includes the first section 82 and the second section 90 is placed and secured firmly in the test head bracket 150. A pre-load bracket 156 is placed above the second section 90 to enable the test head to apply pressure on the second section 90 for establishing a firm contact with the low profile connector 92 when the low profile connector 92 is placed between the second section 90 and the DIB during the testing of the DUT.

The first section 82 is mechanically secured to the test head by module stiffeners 154 placed on the both sides of the first section 82. The module stiffeners 154 rest on top of the pre-load bracket 156 to enable the transfer of pressure from the module stiffeners 154 to the pre-load bracket 156. In one embodiment, the pre-load bracket 156 and the second section 90 are placed in such a way the pre-load bracket 156 and the second section 90 are substantially parallel to the DIB during the testing.

Figure 7:
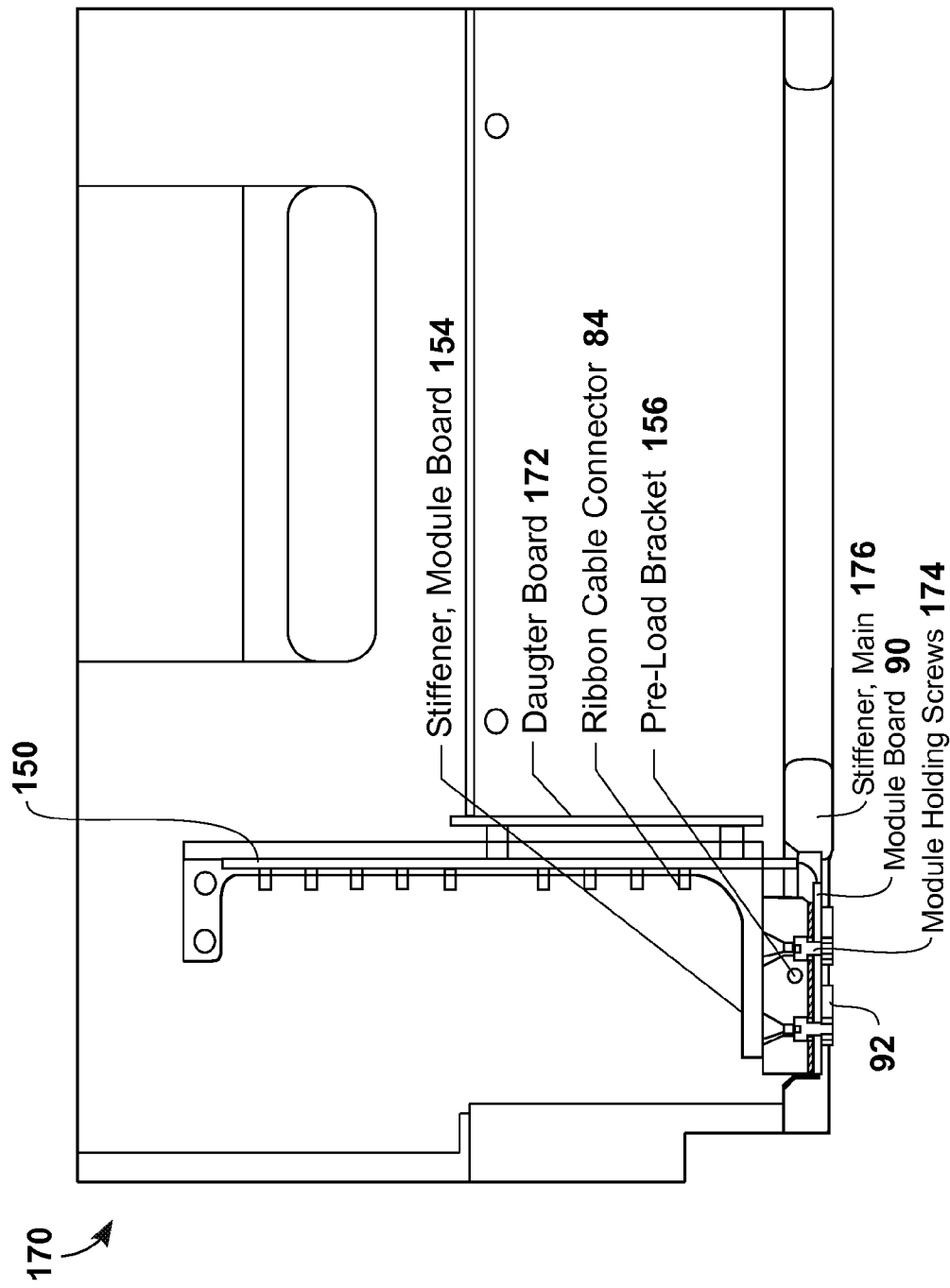
FIG. 7 illustrates positioning of the test head bracket in the test head, in accordance with one embodiment of the present invention.

FIG. 7 illustrates a cross sectional view of a section of a test head 170 in accordance with one embodiment. In this embodiment, the test head 170 is circular in shape with flat top and bottom surfaces and a hollow circular section around the center of the test head 170. In another embodiment, the test head 170 could be of any shape so long as the test head 170 is capable of enabling placement of one or more test head brackets 150.

Figure 8:
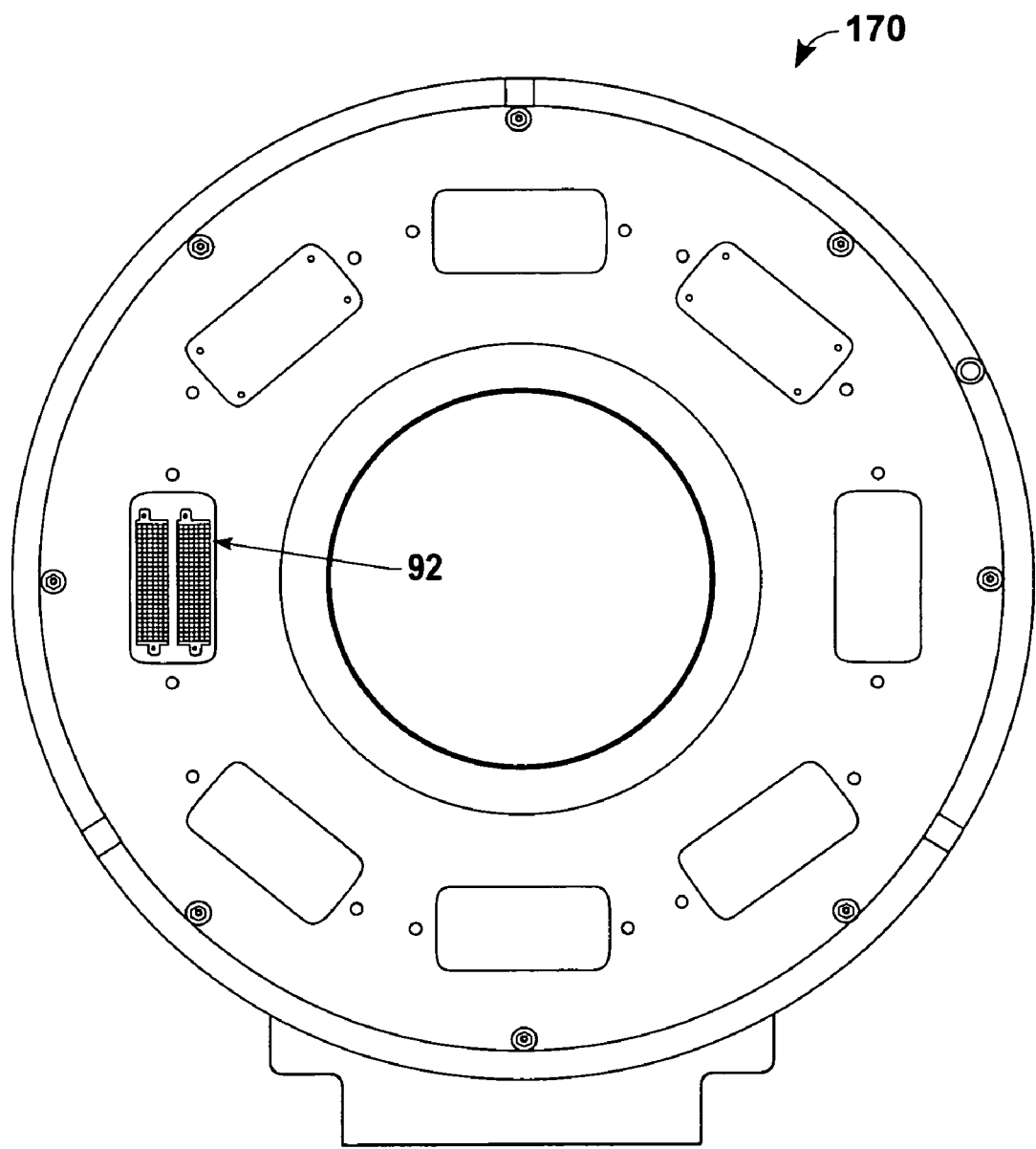
FIG. 8 illustrates a bottom view of the test head showing the low profile connectors, in accordance with one embodiment of the present invention.

FIG. 8 illustrates the test head 170 from a bottom view. In one embodiment, a plurality of test head brackets 150 (see FIG. 7) can be placed inside of the hollow section and around the periphery of the test head 170. The test head 170 is mechanically designed to be able to contain one or more test head brackets 150 in the respective test head bracket holders. In one embodiment, a test head bracket 150 is placed in each one of the test head bracket holder. In another embodiment, one or more test head bracket holders are left empty.

Now referring back to FIG. 7, which further illustrates relative positions of various components in the test head 170, in accordance with one embodiment of the test head 170. The test head bracket 150 including the module board stiffener 154, the ribbon cable connector 84, the pre-load bracket 156, the low profile connector 92, and the module board 80 is placed in the test head 170 and secured by the module holding screws 174. The placement of the test head bracket 150 is such that the low profile connector 92 is projected out of the bottom surface of the test head 150.

In one embodiment, the test extender/daughter board 172 is secured to the module board 80 towards the center of the test head 170 for optimum space use. From the inside view of the test head 170, it is apparent that use of the flexible board 88 in the module board 80 enables space optimization inside of the test head 170. Without the flexible board 88, the module board 80 would have to be placed vertically, resulting in increase of the height of the test head 170, or horizontally, resulting in increase of the bottom surface are of the test head 170. Use of the flexible board 88 enables placing a part of the module board 80 in the bottom of the test head. This design reduces the overall size of the test head 170 because the second section 90 is taking the space that would be needed for the connector 58. Additionally, the second section 90 provides an interface for the spatially efficient low profile connector 92.

Figure 9:
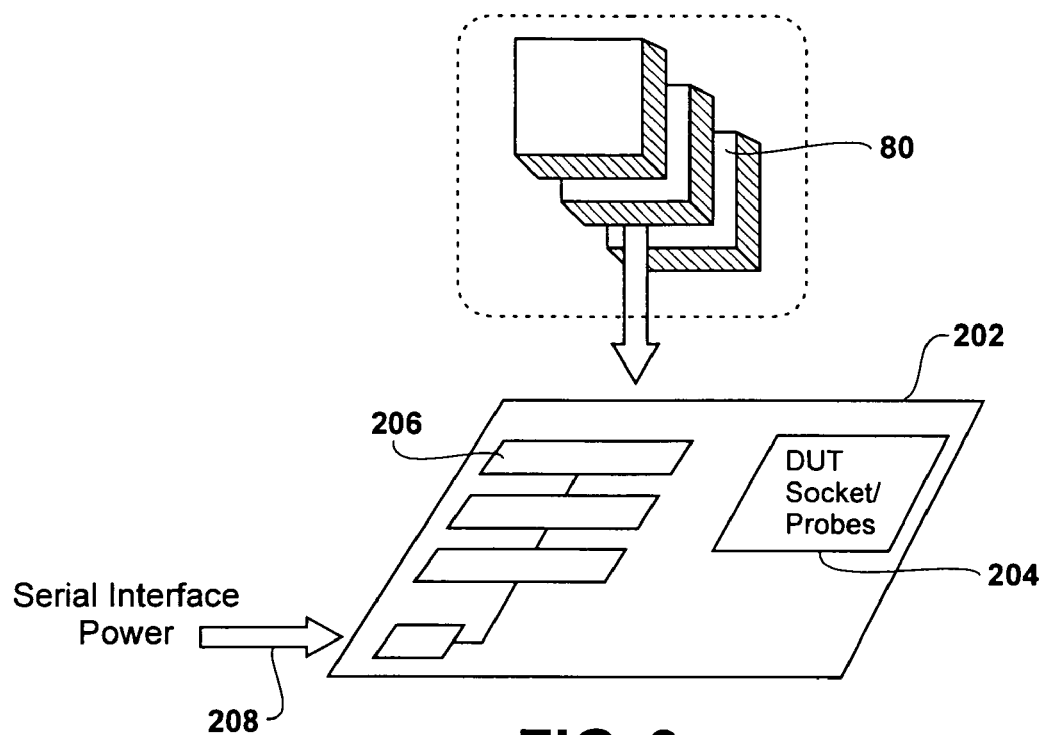
FIG. 9 illustrates the interface between the module board and the DUT, in accordance with one embodiment of the present invention.

FIG. 9 illustrates various interfaces involved in the testing of the DUT. A modular mechanical design enables use of one or more module boards 80. More than one module board 80 can be used depending upon the DUT testing requirements. In one embodiment, use of more than one module board 80 may also be employed to test multiple DUTs in parallel, thereby increasing efficiency and productivity.

Still referring to FIG. 9, in one embodiment, broadly speaking, there are three main functional components involved in the testing of the device under test (DUT); the module board 80, the device interface board (DIB) 202 and the DUT. The module board 80 and the test head 170 side of the DIB 202 conforms to a DIB to module board interface 206. The DUT side of the DIB 202 conforms to a DUT required interface. Hence, the same module board 80 can be used to test any DUT as long as there is a DIB 202 conforming to the DIB to module board interface 206. In one embodiment, the DUT side of the DIB 202 includes a plurality of probes to enable electrical and mechanical coupling of the DUT to the DIB 202. The serial interface power 208 is provided to enable extending testing capabilities of the DIB 202 by enabling a communication through the serial interface.

Figure 10:
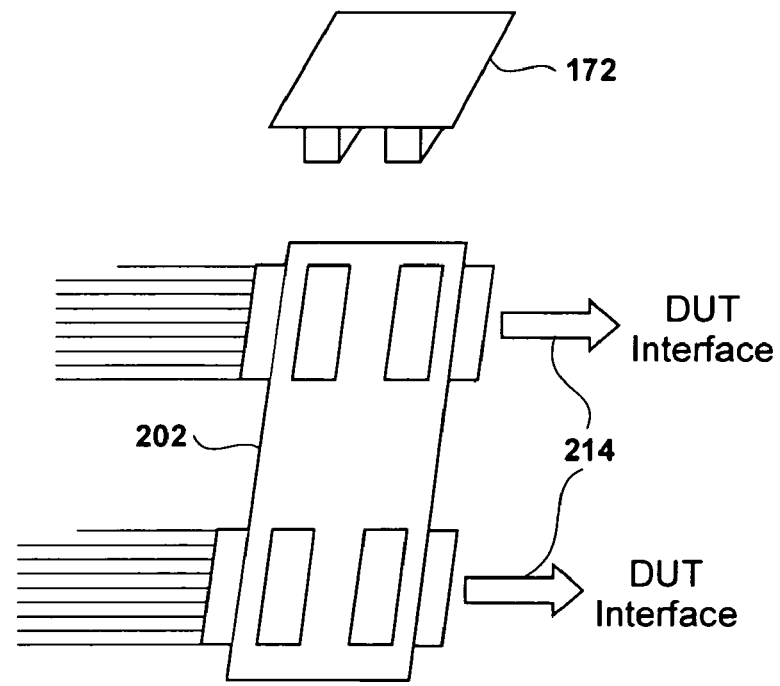
FIG. 10 illustrates a test extender, in accordance with one embodiment of the present invention.

FIG. 10 illustrates a DIB 202, a test extender 172 interface and a DUT interface 214. The DIB 202 acts as a facilitator of the testing of the DUT. The DIB 202 also isolates the module board 80 from the DUT interface 214, thereby allowing the use of same module board 80 for testing various types of DUTs (e.g. analog devices, digital devices, mixed devices etc.). In one embodiment, the DUT is a programmable logic device. In another example, the DUT is an analog device. In yet another example, the DUT is a programmable logic device having a microprocessor. Of course, the DUT is not limited to a programmable logic device as any integrated circuit may be placed into the test head and tested through the angled modular board and the low profile connector.

Still referring to FIG. 10, the test extender 172 further enhances the testing capabilities by allowing pre-processing of the input data into the DIB 202 from the module board 80 or post processing of the resultant data or signal from the DUT. One of the benefits of the test extender 172 is that it obviates a need for changing the DIB 202 or the analyzer side of the testing for extending the tests to be run on the DUT. In this modular design, a test can be extended or modified simply by adding another test extender 172. Hence, a need to modify test analyzer side of testing infrastructure, DIB 202, or module board 80 is reduced.

With the above embodiments in mind, it should be understood that the invention may employ other variations in the mechanical design, configurations and relative positions of the various components. It will be appreciated that those skilled in the art upon reading the specifications and studying the drawings will realize various alterations, additions, permutations and equivalents thereof. It is therefore intended that the present invention includes all such alterations, additions, permutations, and equivalents as fall within the true spirit and scope of the invention.

Any of the operations described herein that form part of the invention are useful machine operations. The invention also relates to a device or an apparatus for performing these operations. The apparatus can be specially constructed for the required purpose, or the apparatus can be a general-purpose computer selectively activated, implemented, or configured by a computer program stored in the computer. In particular, various general-purpose machines can be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims. It should be appreciated that exemplary claims are provided below and these claims are not meant to be limiting for future applications claiming priority from this application. The exemplary claims are meant to be illustrative and not restrictive.

What is claimed is:

1. A module board for providing a test interface coupling between a test analyzer and a device under test (DUT) comprising:
    a first section having a plurality of connectors extending from a surface of the first section, the first section configured to couple the test analyzer to the module board through the plurality of connectors;
    a second section configured to couple the test analyzer to a device interface board (DIB); and
    a flexible board enabling electrical and mechanical coupling of the first section and the second section, wherein the flexible board is capable of being bent to enable the first section to be placed at an angle relative to the second section.

2. The module board for testing a DUT as recited in claim 1, wherein the first section further including one or more connectors to enable interface with a test extender board.

3. The module board for testing a DUT as recited in claim 2, wherein the one or more connectors to enable interface with the test extender board are located on an opposing side of the module board from the plurality of connectors.

4. The module board for testing a DUT as recited in claim 1, wherein the second section further includes a plurality of electrical contact pads to enable interface with a low profile connector which provides coupling between the second section and the DIB.

5. The module board for testing a DUT as recited in claim 4, wherein an electrical contact between the plurality of electrical contact pads and the low profile connector is established by pressing the low profile connector and the second section together.

6. The module board for testing a DUT as recited in claim 1, wherein the angle is about 90 degrees.

7. The module board for testing a DUT as recited in claim 1, the second section is placed substantially parallel to the DIB during testing of the DUT.

8. The module board for testing a DUT as recited in claim 1, wherein the flexible board includes a polyimide material.

9. The module board for testing a DUT as recited in claim 1, wherein the test extender is configured to enhance testing capabilities of the test analyzer by one of pre-processing input data into the DUT or post processing data output from the DUT.

10. The module board for testing a DUT as recited in claim 1, wherein the DIB isolates the module board from a DUT interface, and wherein the DIB includes a plurality of probes that enable electrical and mechanical coupling of the DUT to the DIB.

11. The module board for testing a DUT as recited in claim 1, wherein the plurality of connectors extending from the surface of the first section couple the test analyzer to the module board through a ribbon cable.

12. A module board for providing a test interface coupling between a test analyzer and a device under test (DUT) comprising:
    a first section having a plurality of connectors extending from a surface of the first section for accepting a ribbon cable, the first section configured to couple the test analyzer to the module board through the ribbon cable;
    a second section configured to couple the test analyzer to a device interface board (DIB); and
    a flexible board enabling electrical and mechanical coupling of the first section and the second section, wherein the flexible board is capable of being bent to enable the first section to be placed at an angle relative to the second section.

* * * * *